United States Patent
Takano et al.

(10) Patent No.: US 11,768,299 B2
(45) Date of Patent: Sep. 26, 2023

(54) RADIATION ANALYZER

(71) Applicant: Hitachi High-Tech Corporation, Tokyo (JP)

(72) Inventors: Akira Takano, Tokyo (JP); Keiichi Tanaka, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 162 days.

(21) Appl. No.: 17/276,415

(22) PCT Filed: Nov. 16, 2018

(86) PCT No.: PCT/JP2018/042449
§ 371 (c)(1),
(2) Date: Mar. 15, 2021

(87) PCT Pub. No.: WO2020/100281
PCT Pub. Date: May 22, 2020

(65) Prior Publication Data
US 2022/0035053 A1 Feb. 3, 2022

(51) Int. Cl.
*G01T 1/16* (2006.01)
*G01R 33/035* (2006.01)
(Continued)

(52) U.S. Cl.
CPC ........ *G01T 1/1606* (2013.01); *G01R 33/0354* (2013.01); *G01T 1/006* (2013.01); *G01T 1/26* (2013.01)

(58) Field of Classification Search
CPC .......... G01T 1/1606; G01T 1/006; G01T 1/26
See application file for complete search history.

(56) References Cited

U.S. PATENT DOCUMENTS

| 4,853,538 A | 8/1989 | Jackson |
| 9,678,227 B2 * | 6/2017 | Tanaka ................. G01T 1/1606 |

(Continued)

FOREIGN PATENT DOCUMENTS

| JP | 64-50918 A | 2/1989 |
| JP | 2004-226147 A | 8/2004 |

(Continued)

OTHER PUBLICATIONS

Eixelberger et al.—WO 2018/041902 A1—Google Patent English obtained Dec. 6, 2022 (Year: 2022).*

(Continued)

*Primary Examiner* — David P Porta
*Assistant Examiner* — Casey Bryant
(74) *Attorney, Agent, or Firm* — Crowell & Moring LLP

(57) ABSTRACT

To provide a radiation analyzer that can perform analyses by a long-term stable and high energy resolution without correcting a current flowing through a transition edge sensor (hereinafter referred to as TES) or a pulse height value of a signal pulse. The radiation analyzer includes: a TES 1 configured to detect radiation; a current detection mechanism 4 configured to detect a current flowing through the TES 1; a pulse height analyzer 5 configured to measure a pulse height value based on the current detected by the current detection mechanism 4; a baseline monitor mechanism 6 configured to detect a baseline current flowing through the TES 1; a first heater 13 whose output is adjusted to stabilize a temperature of a first thermometer 12 disposed in a cold head that cools the TES 1; and a second heater 14 that is disposed fairly close to the TES 1 and whose output is adjusted to stabilize a baseline current.

14 Claims, 9 Drawing Sheets

(51) Int. Cl.
*G01T 1/26* (2006.01)
*G01T 1/00* (2006.01)

(56) References Cited

U.S. PATENT DOCUMENTS

| | | |
|---|---|---|
| 2009/0278046 A1 | 11/2009 | Allen et al. |
| 2014/0048717 A1* | 2/2014 | Tanaka .................... G01T 1/16 |
| | | 250/336.1 |

FOREIGN PATENT DOCUMENTS

| | | |
|---|---|---|
| JP | 2009-271016 A | 11/2009 |
| JP | 2009-276191 A | 11/2009 |
| JP | 2010-48821 A | 3/2010 |
| JP | 2014-38074 A | 2/2014 |
| WO | WO-2018041902 A1 * | 3/2018 ........... B07C 5/3425 |

OTHER PUBLICATIONS

International Search Report (PCT/ISA/210) issued in PCT Application No. PCT/JP2018/042449 dated Jan. 15, 2019 with English translation (four (4) pages).
Japanese-language Written Opinion (PCT/ISA/237) issued in PCT Application No. PCT/JP2018/042449 dated Jan. 15, 2019 (three (3) pages).

\* cited by examiner

[FIG. 1]
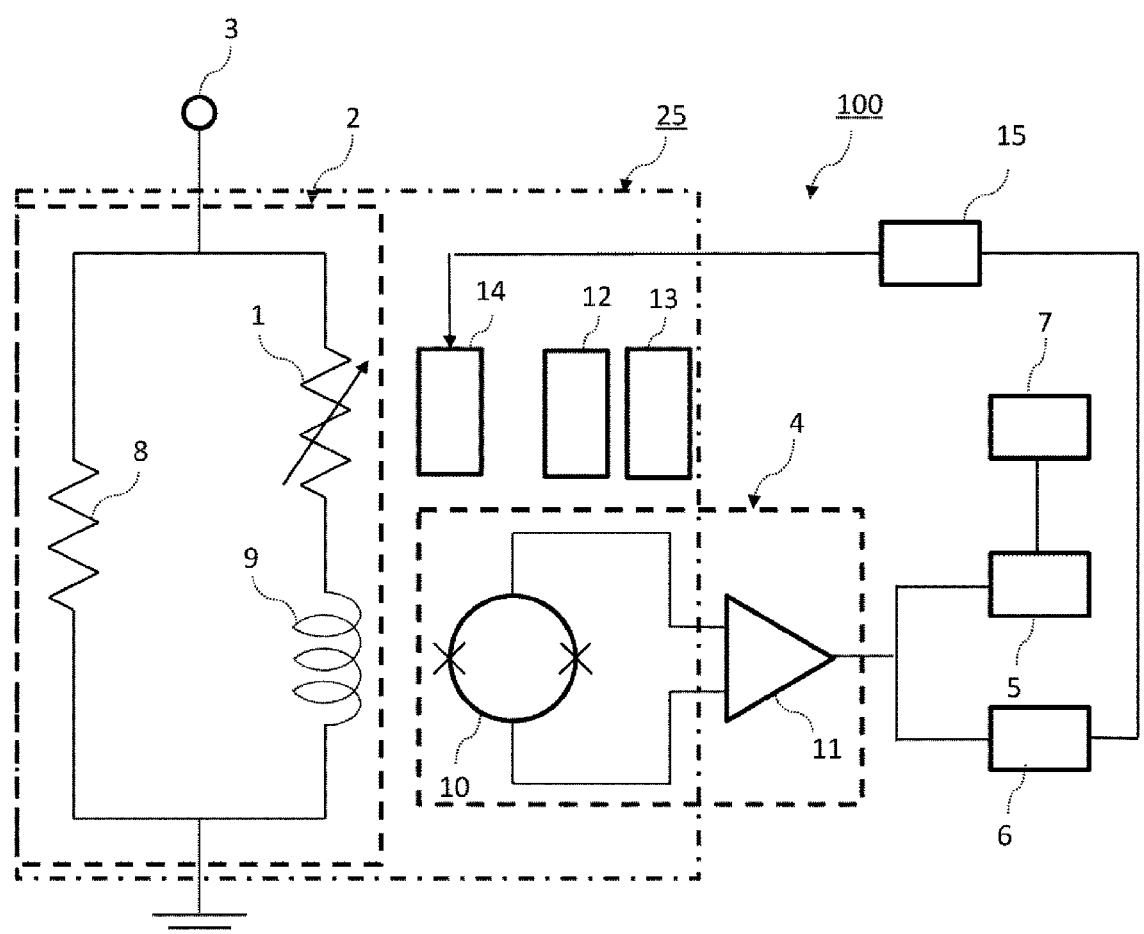

[FIG. 2]
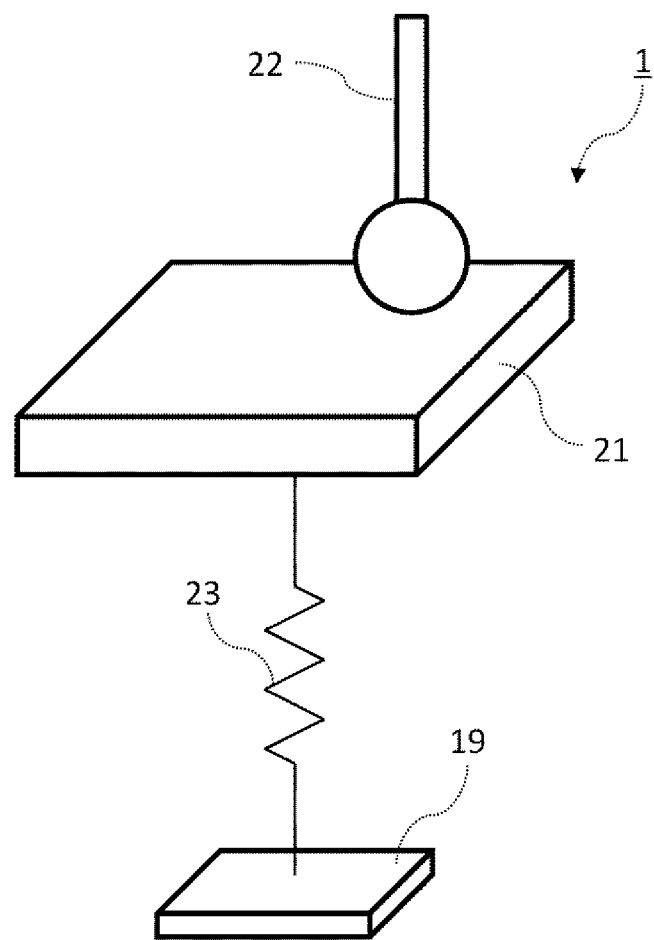

[FIG. 3]
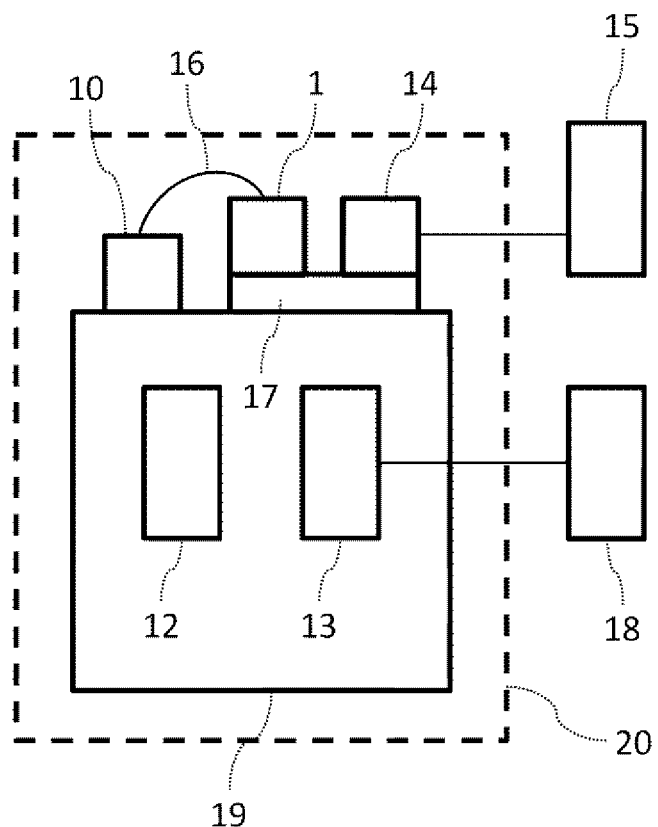

[FIG. 4]
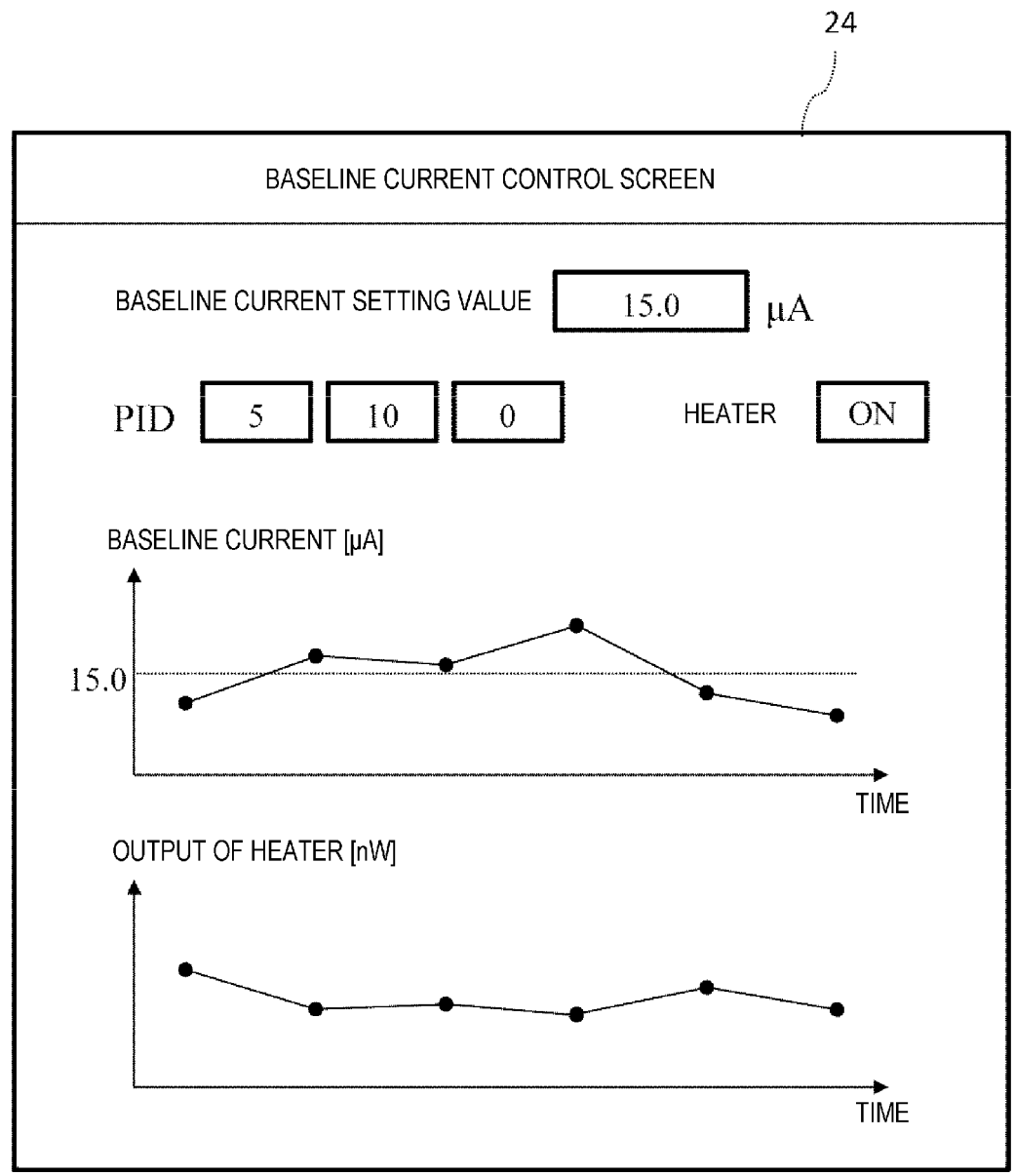

[FIG. 5]
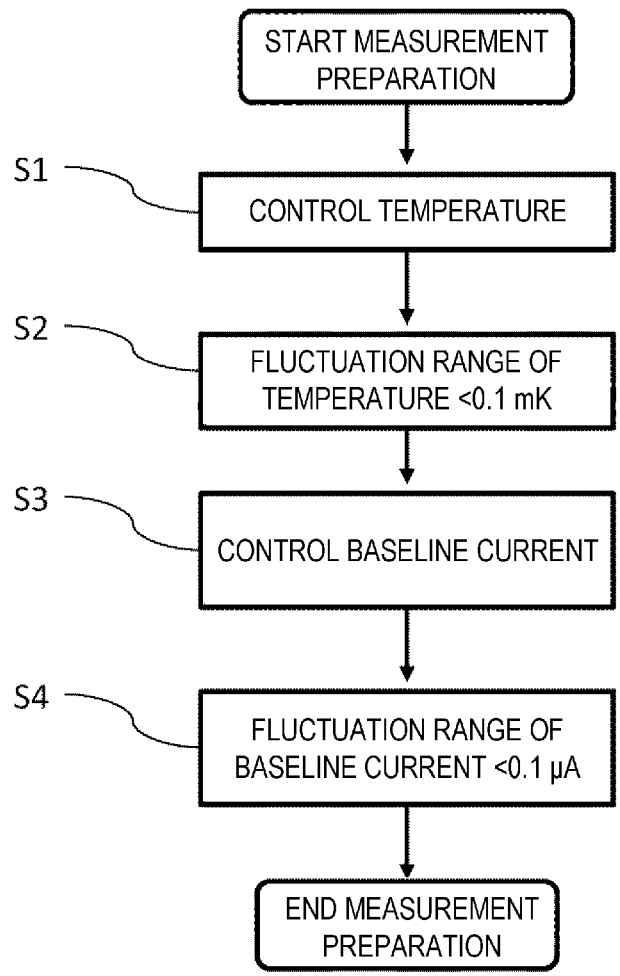

[FIG. 6]
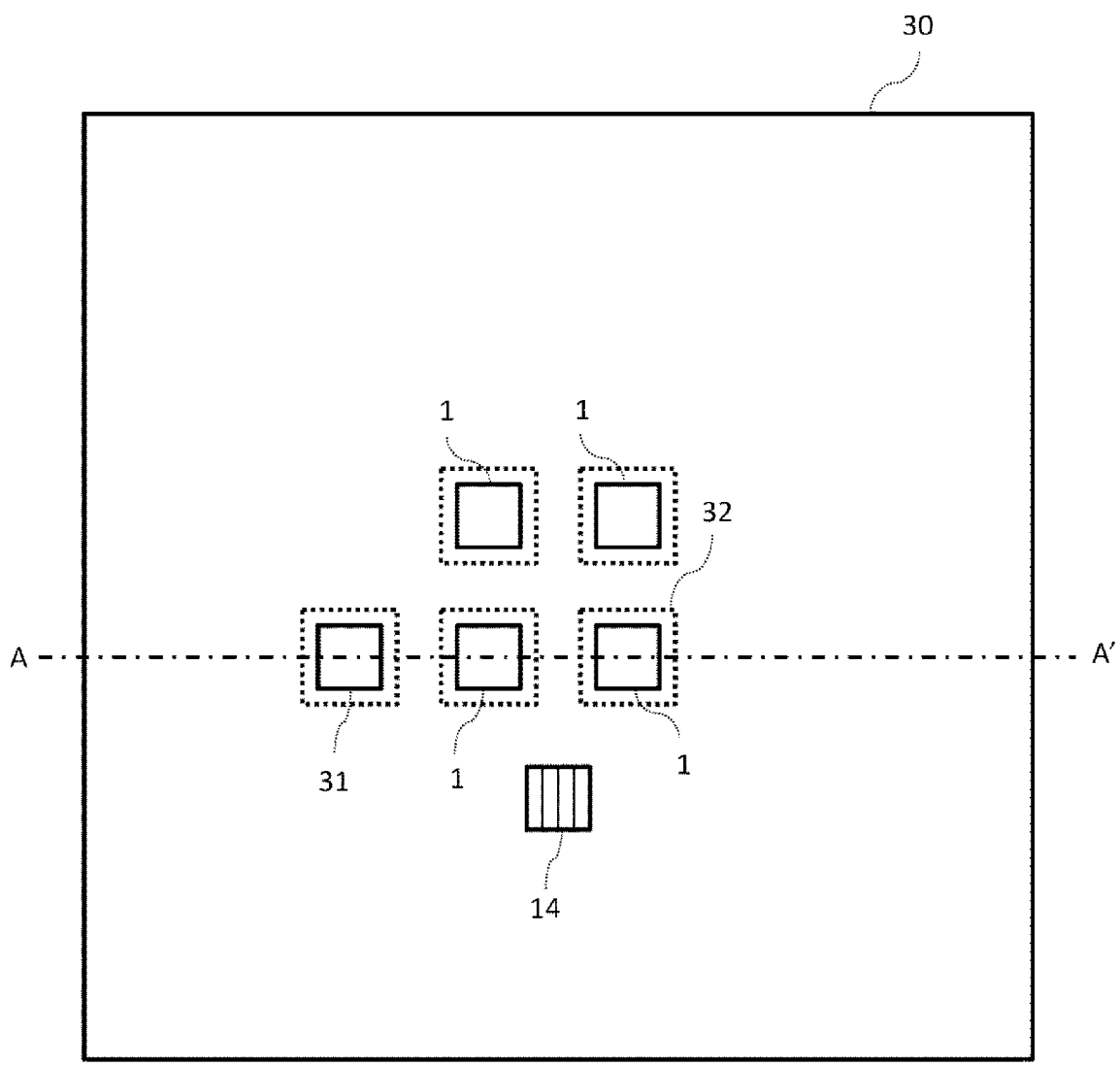

[FIG. 7]
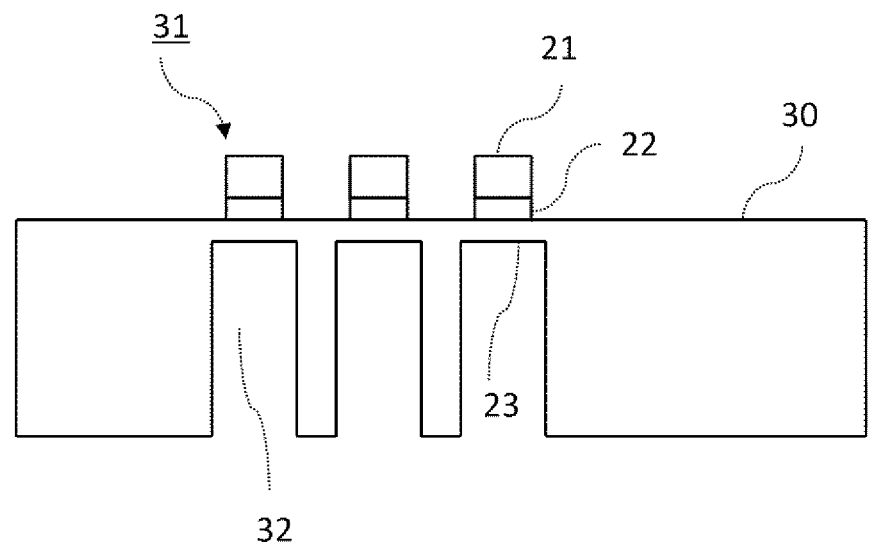
[FIG. 8]
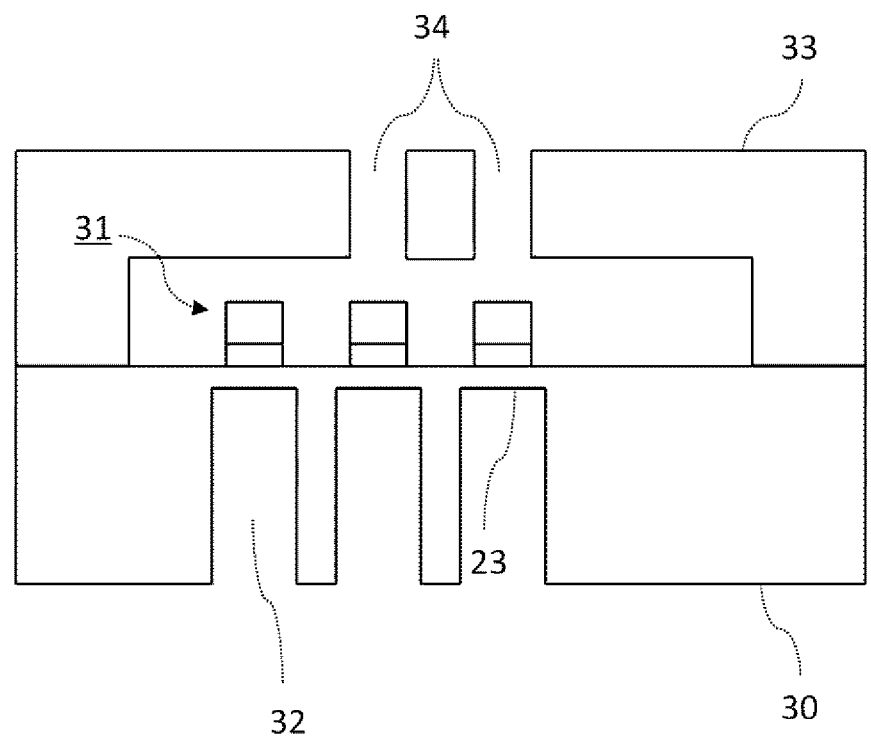

[FIG. 9]
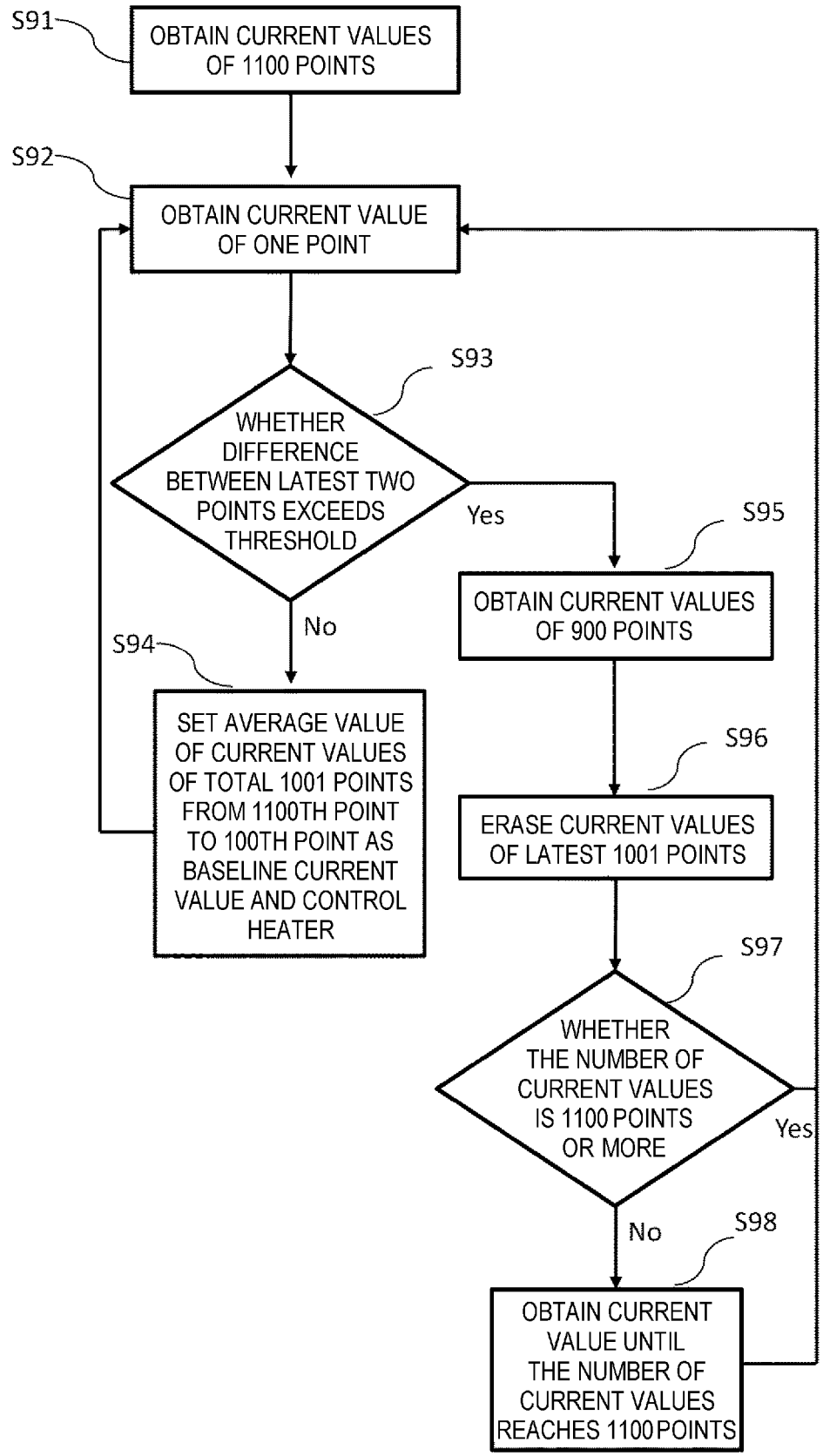

[FIG. 10]
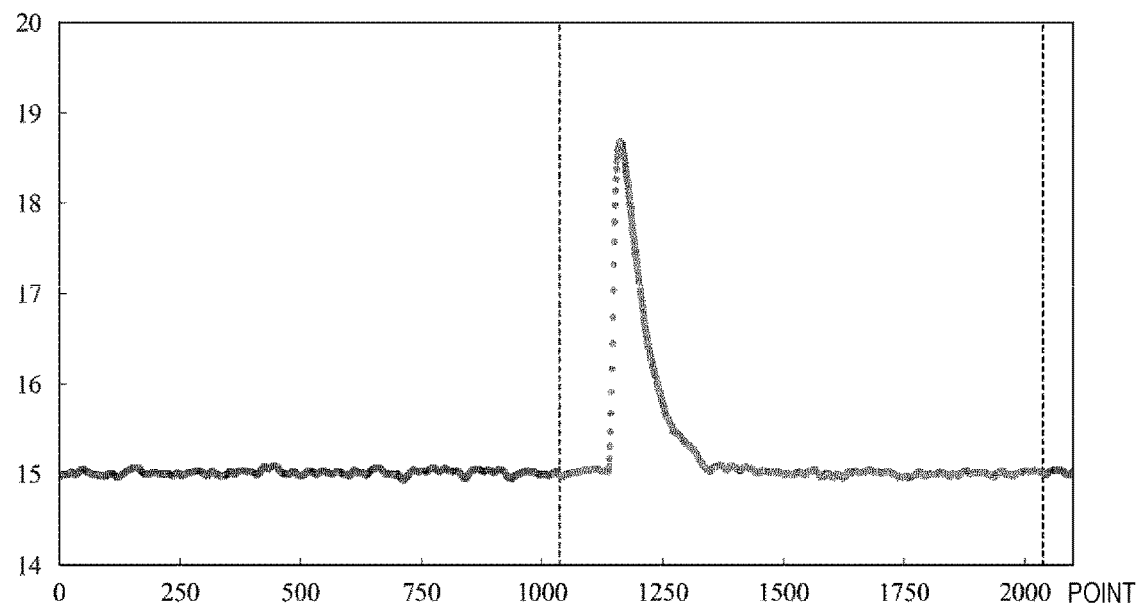

RADIATION ANALYZER

TECHNICAL FIELD

The present invention relates to a radiation analyzer including a radiation detector implemented by a transition edge sensor.

BACKGROUND ART

As a radiation analyzer capable of recognizing energy of radiation, there are an energy dispersive spectroscopy (hereinafter referred to as EDS) and a wavelength dispersive spectroscopy (hereinafter referred to as WDS). The EDS is a type of X-ray detector that converts the energy of X-rays captured by the detector into an electric signal in the detector and calculates the energy based on a magnitude of the electric signal. The WDS is a type of X-ray detector that monochromatizes X-rays with a spectroscope and detects the monochromatic X-rays with a proportional counter or the like.

As the EDS, semiconductor detectors such as a silicon lithium type detector, a silicon drift type detector, or a germanium type detector are known. For example, a silicon lithium type or a silicon drift type detector is used in an elemental analyzer of an electron microscope and can detect energy in a range of 0.1 keV to 20 keV. However, since silicon is used for the detector, the performance thereof depends on a band gap of silicon (about 1.1 eV), it is difficult to improve an energy resolution to about 120 eV or less, and the energy resolution is 10 times or more inferior to the WDS.

The energy resolution, which is an indicator of the performance of the X-ray detector, of 120 eV, for example, means that the energy can be detected with an uncertainty of 120 eV when the X-ray detector is irradiated with X-rays. The smaller the uncertainty is, the higher the energy resolution is. When X-rays including two adjacent spectra with an energy difference of about 20 eV are detected, two peaks can be separated if the energy resolution is about 20 eV to 30 eV.

In recent years, energy dispersive superconducting X-ray detectors having the same energy resolution as the WDS have been attracting attention. Among these superconducting X-ray detectors, a detector implemented by a transition edge sensor (hereinafter referred to as TES) is a highly sensitive calorimeter that uses a sudden change in a resistance value (for example, a change in a resistance value with a temperature change of several mK is 100 mΩ) between superconductivity and normal conduction in a metal thin film. The TES is also called a microcalorimeter.

The TES analyzes a sample by detecting a temperature change of the TES that occurs when fluorescent X-rays or characteristic X-rays generated from the sample by irradiation such as primary X-rays or primary electron beams enter the TES. The TES has a higher energy resolution than a semiconductor detector, for example, an energy resolution of 10 eV or less can be obtained for X-rays of 5.9 keV.

When the TES is attached to an electron microscope, peaks of characteristic X-rays (for example, Si-Kα, W-Mα, W-Mβ) which cannot be separated by a semiconductor detector can be easily separated by the TES obtaining the X-rays generated from the sample irradiated with electron beams. In an X-ray analyzer equipped with the TES, a superconducting quantum interference device (hereinafter referred to as SQUID) amplifier is used to read out a minute current change of the TES.

In order to implement the high energy resolution in the TES, it is necessary to keep a baseline current flowing through the TES constant. As a device that keeps the baseline current flowing through a TES constant, for example, there is known an X-ray analyzer that corrects the current flowing through the TES or a pulse height value of a signal pulse of the TES according to a fluctuation range when the baseline current flowing through the TES deviates and fluctuates from a default value (see PTL 1). There is further known a radiation analyzer that corrects a pulse height value of a signal pulse of the TES based on a correlation between output of a heater provided in a cold head where a TES is disposed and a baseline current flowing through the TES (see PTL 2). The radiation analyzer obtains correlation characteristics between the output of the heater and the sensitivity of the TES in advance, and uses the sensitivity of the TES corresponding to the output of the heater when obtaining the signal pulse of the TES during actual measurement to correct the pulse height value of the signal pulse of the TES.

CITATION LIST

Patent Literature

PTL 1: JP-A-2009-271016
PTL 2: JP-A-2014-038074

SUMMARY OF INVENTION

Technical Problem

However, the above-described X-ray analyzer and radiation analyzer have a problem that a process for obtaining a measurement result is complicated. Further, there are problems that the correction accuracy is lowered due to an error of detection data used for correction and the reliability of data is lowered due to addition of the correction to raw data.

In view of the above problems, an object of the invention is to provide a radiation analyzer that can obtain a long-term stable and high energy resolution without the need to correct a current flowing through a TES or a pulse height value of a signal pulse of the TES.

Solution to Problem

In order to achieve the above object, the invention provides a radiation analyzer including: a TES configured to detect radiation; a current detection mechanism configured to detect a current flowing through the TES; a pulse height analyzer configured to measure a pulse height value based on the current detected by the current detection mechanism; a baseline monitor mechanism configured to detect a baseline current flowing through the TES; a cold head configured to cool the TES; a first heater whose output is adjusted to stabilize a temperature of the cold head; and a second heater whose output is adjusted to stabilize the baseline current.

Advantageous Effect

According to the radiation analyzer of the invention, it is possible to obtain a long-term stable and high energy resolution by a direct method with high data reliability without the need to correct a current flowing through a TES or a pulse height value of a signal pulse of the TES.

BRIEF DESCRIPTION OF DRAWINGS

FIG. 1 is a diagram schematically showing a configuration of a radiation analyzer according to a first embodiment.

FIG. 2 is a diagram schematically showing a configuration of a TES of the radiation analyzer according to the first embodiment.

FIG. 3 is a diagram schematically showing a configuration of a part of the radiation analyzer according to the first embodiment.

FIG. 4 is a diagram showing an example of a GUI screen for adjusting output of a second heater and a baseline current of the radiation analyzer according to the first embodiment.

FIG. 5 is a flowchart showing an operation of the radiation analyzer according to the first embodiment.

FIG. 6 is a plan view showing a configuration example of a TES chip of a radiation analyzer according to a second embodiment.

FIG. 7 is a cross-sectional view showing a cross section of the configuration example of the TES chip according to the second embodiment.

FIG. 8 is a cross-sectional view showing a cross section of a configuration example of a TES chip having a collimator according to the second embodiment.

FIG. 9 is a flowchart showing functions of baseline monitor mechanisms of TESs of the radiation analyzers according to the first and second embodiments.

FIG. 10 is a diagram showing an example of baseline current values of the TESs of the radiation analyzers according to the first and second embodiments.

DESCRIPTION OF EMBODIMENTS

Hereinafter, various embodiments of the invention will be described with reference to the drawings, and will be outlined prior to the description. As described above, a radiation analyzer includes a second heater whose output is adjusted to stabilize a baseline current flowing through a TES detected by a baseline monitor mechanism. When the baseline current detected by the baseline monitor mechanism deviates and fluctuates from a default value, the output of the second heater is adjusted to prevent the fluctuation. Accordingly, the baseline current flowing through the TES becomes constant and a constant pulse height value of a signal pulse can be obtained for radiation having the same energy. Accordingly, a long-term stable and high energy resolution can be obtained.

Further, the radiation analyzer preferably includes a GUI screen for adjusting the baseline current detected by the baseline monitor mechanism and the output of the second heater. With the GUI screen, it is possible to confirm that the baseline current is stable, which enhances the convenience of the system.

Further, the radiation analyzer can be provided with a baseline monitor TES in addition to the TES that detects radiation. The baseline monitor TES is provided with a shield that shields radiation. That is, by providing a TES specialized for a baseline monitor that is not affected by radiation, it is possible to control the baseline current with high accuracy.

Furthermore, the radiation analyzer is preferably configured such that the second heater is disposed on the same chip as the TES that detects radiation. Accordingly, the radiation analyzer is more efficient and responsive, and it is possible to control the baseline current by the output of the second heater.

First Embodiment

In the first embodiment, a radiation analyzer includes: a TES configured to detect radiation; a current detection mechanism configured to detect a current flowing through the TES; a pulse height analyzer configured to measure a pulse height value based on the current detected by the current detection mechanism; a baseline monitor mechanism configured to detect a baseline current flowing through the TES; a cold head configured to cool the TES; a first heater whose output is adjusted to stabilize a temperature of the cold head; and a second heater whose output is adjusted to stabilize the baseline current.

FIG. 1 is a diagram schematically showing a configuration of the radiation analyzer according to the present embodiment. FIG. 2 is a diagram schematically showing a configuration of the TES of the radiation analyzer according to the present embodiment. FIG. 3 is a diagram schematically showing a configuration of a part of the radiation analyzer according to the present embodiment.

A radiation analyzer 100 according to the present embodiment is a device that can be used as a component analyzer implemented by, for example, an electron microscope, an ion microscope, an X-ray microscope, and a fluorescent X-ray analyzer. As shown in FIG. 1, the radiation analyzer 100 includes a TES 1, a sensor circuit unit 2, a bias current source 3, a current detection mechanism 4, a pulse height analyzer 5, a baseline monitor mechanism 6, a spectrum display unit 7, a first thermometer 12, a first heater 13, a second heater 14, and a baseline control unit 15. The first thermometer 12 and the first heater 13 are disposed inside a cold head described later, and the second heater is disposed at a position fairly close to the TES 1 within about 1 cm. A region surrounded by a dotted and dashed line schematically shows a refrigerator 25, and clarifies elements disposed inside the refrigerator.

When the TES 1 receives radiation, the TES 1 detects the energy as a temperature change and outputs the temperature change as a current signal. The sensor circuit unit 2 is connected to the TES 1. The bias current source 3 sends a current for pseudo-driving the sensor circuit unit 2 at a constant voltage to the sensor circuit unit 2. The current detection mechanism 4 detects a current flowing through the TES 1. The pulse height analyzer 5 measures a pulse height value of a signal pulse of the TES detected by the current detection mechanism 4. The spectrum display unit 7 displays an energy spectrum using the measured pulse height value.

The sensor circuit unit 2 includes a shunt resistor 8 connected in parallel with the TES 1 and having a resistance value smaller than that of the TES 1 and an input coil 9 connected in series with the TES 1. In the sensor circuit unit 2, when a bias current is passed from the bias current source 3, the current is branched at a resistance ratio between the resistance value of the shunt resistor 8 and the resistance value of the TES 1. That is, a voltage value of the TES 1 is determined by a voltage value determined by the current flowing through the shunt resistor 8 and the resistance value of the shunt resistor 8.

The current detection mechanism 4 includes a SQUID amplifier 10 and a room temperature amplifier 11 for amplifying and shaping an electric signal output from the SQUID amplifier 10. The SQUID amplifier 10 and the room temperature amplifier 11 using the input coil 9 are used as the current detection mechanism 4, and other configurations may be adopted as long as a change in the current flowing through the TES 1 can be detected.

As shown in FIG. 2, the TES 1 includes an absorber 21, a second thermometer 22, and a membrane 23. Further, as shown in FIG. 3, the TES 1, the shunt resistor 8, and the SQUID amplifier 10 are provided at a top end of a cold head 19 which is cooled from 50 mK to 400 mK by the refrigerator. The TES 1 and the SQUID amplifier 10 are connected by a superconducting wiring 16. The SQUID amplifier 10, a TES chip 17 on which the TES 1 and the second heater 14 are disposed, the cold head 19, and the like are surrounded by a heat shield 20. In FIG. 3, the shunt resistor 8 is not shown.

An operation principle of the TES 1 according to the present embodiment will be described. The TES 1 uses superconducting transition possessed by a superconductor, and in a radiation detection operation, an operation point is maintained in an intermediate state between normal conduction and superconductivity. Accordingly, when one radiation is absorbed by the TES 1, in a state where the operation point is maintained during the superconducting transition, for example, a resistance value change of several mΩ can be obtained corresponding to a temperature fluctuation of 100 μK, and a signal pulse on the order of μA can be obtained. Further, by storing data obtained by obtaining a relationship between the pulse height value and energy of radiation in advance, when radiation having unknown energy is emitted to the TES 1, the energy of the emitted radiation can be detected based on the pulse height value.

When the TES 1 is maintained at the operation point during the superconducting transition, the operation point of the TES 1 is determined by a thermal balance between the current flowing through the TES 1 (hereinafter referred to as a TES current It) and a thermal link to the cold head. Since the energy resolution of the TES 1 is a function of a temperature, it is better to keep the temperature as low as possible. A cold head temperature is, for example, about 50 mK to 400 mK. The TES current It is determined by the following Equation (1).

[Equation 1]

$$It^2 Rt(T) = G(T-Tb) \quad (1)$$

In the above Equation (1), the TES current It is described by an operation resistance Rt of the TES 1, a thermal conductivity G of the thermal link for thermally connecting the second thermometer 22 provided on the TES 1 and the cold head 19, a temperature T of the second thermometer 22, and a temperature Tb of the cold head 19. Here, the baseline current means a TES current in a state where the TES 1 is not irradiated with radiation.

Further, a relationship between the TES current It and a pulse height value ΔI is given by the following Equation (2). Ideally, if the TES current It is constant, the permanently constant pulse height value ΔI can be obtained.

[Equation 2]

$$It = \frac{CT}{\alpha E} \Delta I \quad (2)$$

In the above Equation (2), the TES current It and the pulse height value ΔI are described by a sensitivity α of the TES 1, a heat capacity C, energy E of the emitted radiation, and the temperature T of the second thermometer 22. As can be seen from Equation (2), when the baseline current flowing through the TES 1 changes, the pulse height value of the signal pulse differs even if radiation having the same energy is emitted to the TES 1. Further, as can be seen from Equation (1), the baseline current changes as the temperature of the cold head 19 changes. That is, when the temperature of the cold head 19 fluctuates, the pulse height value ΔI fluctuates, and thus the energy resolution deteriorates.

The pulse height value of the signal pulse accompanying the temperature change of the TES 1 when the TES 1 is irradiated with radiation changes in an increasing tendency as the current flowing through the SQUID amplifier 10 (equal to the TES current It) increases according to Equation (2). As an example of the pulse height value ΔI, a calculated value obtained by convolving the signal pulse with a filter is output to the spectrum display unit 7.

At this time, on a spectrum display screen of the spectrum display unit 7, a horizontal axis is the pulse height value ΔI and a vertical axis is a count. For example, when the pulse height value ΔI is 100, one is counted at a point of 100. A radiation spectrum is formed by repeating the above operation.

Regardless of a fact that the radiation having the same energy is emitted, the change in the calculated value after the filter means that the pulse height value ΔI varies. A degree of the variation corresponds to the above-described energy resolution. That is, in order to implement high energy resolution, it is necessary to make the variation of the pulse height value ΔI small for the radiation having the same energy.

One factor in the variation of the pulse height value ΔI is the change in the current flowing through the SQUID amplifier 10. Therefore, in order to implement the high energy resolution, a method for keeping the current flowing through the SQUID amplifier 10 constant is necessary.

Details of the operation of the radiation analyzer 100 according to the present embodiment will be described later. The pulse height analyzer 5 shown in FIG. 1 is a multi-channel pulse height analyzer that obtains the pulse height value of the signal pulse from the signal pulse of the TES transmitted from the room temperature amplifier 11 and generates an energy spectrum. The pulse height analyzer 5 reads the pulse height value of the signal pulse, and adds 1 to the point of the pulse height value in a histogram with the vertical axis as the count and the horizontal axis as the pulse height value. The pulse height analyzer 5 has a function of creating a histogram by repeating the same operation for a plurality of signal pulses of the radiation and displaying the histogram on the spectrum display unit 7. Further, if data for converting the pulse height value of the signal pulse into energy is incorporated in the pulse height analyzer 5 or the spectrum display unit 7 in advance, a spectrum with the count on the vertical axis and the energy on the horizontal axis can be displayed.

As shown in FIG. 3, the first thermometer 12 that monitors the temperature of the cold head 19 is provided inside the cold head 19. A semiconductor, superconductor, or metal oxide is used for the first thermometer 12. For example, ruthenium oxide or germanium is used for the first thermometer 12. Since a resistance value of the first thermometer 12 changes with the temperature of the cold head 19, by correlating the temperature with the electric signal output from the first thermometer 12 in advance, a temperature state of the cold head 19 can be grasped.

The spectrum display unit 7 includes a display, an arithmetic circuit, and a memory. The display, the arithmetic circuit, and the memory of the spectrum display unit 7 are implemented by, for example, a display unit of a personal computer (PC), program processing of a central processing unit (CPU), and dedicated hardware, and can receive the pulse height value of the signal pulse from the pulse height analyzer 5 and display the energy spectrum of the radiation detected by the TES 1.

As shown in FIG. 2, the TES 1 includes the absorber 21, the second thermometer 22, and the membrane 23, and the absorber 21 is a metal, a semimetal, or a superconductor for absorbing radiation such as X-rays. The absorber 21 is made of, for example, gold, copper, and bismuth. The second thermometer 22 is implemented by a superconductor and detects the heat generated by the absorber 21 as a temperature change. The second thermometer 22 is made of, for example, a material including two layers of titanium and gold. The membrane 23 thermally loosely connects the second thermometer 22 and the cold head 19 to control a flow rate of the heat flowing to the cold head 19. The membrane 23 is made of, for example, silicon nitride.

Joule heat generated on the second thermometer 22 when the resistance value of the TES 1 is maintained in the intermediate state between the normal conduction and the superconductivity is thermally balanced with the heat flow flowing from the second thermometer 22 or the absorber 21 through the membrane 23 to the cold head 19. The thermal balance between the Joule heat and the heat flow transmitted through the membrane 23 is given by the above Equation (1). In the above Equation (1), considering that the TES current It is affected by a thermal fluctuation Pex from the outside of the TES 1, the above Equation (1) is rewritten by Equation (3).

[Equation 3]

$$It^2 Rt(T) + \left(V + \frac{GT}{I\alpha}\right)\delta It + Pex = G(T - Tb) \quad (3)$$

When the thermal fluctuation Pex from the outside of the TES 1 increases, δIt of the second item on the left side decreases to satisfy the above Equation (3). Examples of thermal fluctuation Pex from the outside include a temperature fluctuation of the cold head 19 that cools the TES 1, a fluctuation of heat radiation due to a temperature fluctuation of the heat shield 20 surrounding the cold head 19, or heat conduction from the heat shield 20 to the TES 1 due to residual gas existing in the refrigerator.

As shown in the above Equation (2), the pulse height value ΔI increases monotonically when the baseline current, which is the current flowing through the TES 1, increases. That is, in order to make the pulse height value ΔI for the radiation having the same energy constant, it is necessary to make the baseline current constant.

The TES 1 needs to be cooled to around 100 mK. As a cooling method, there is a dilution refrigerator and an adiabatic demagnetization refrigerator (hereinafter referred to as an ADR). The dilution refrigerator adopts a technique of cooling in a mixing chamber by using an enthalpy difference when 3He melts from a rich phase to a dilute phase. The adiabatic demagnetization refrigerator adopts a technique of cooling an object connected to a magnetic body by making use of the fact that a direction of a spin is aligned by applying a magnetic field to the magnetic body and an entropy increases when the magnetic field is removed. The cold head 19 is disposed in a position most cooled by both the dilution refrigerator and the ADR. In the dilution refrigerator and the ADR, the first thermometer 12 that measures a temperature is disposed in the cold head 19, and temperature information of the cold head 19 can be obtained by monitoring the electric signal output from the first thermometer 12. By registering the relationship between the electric signal and the temperature in a temperature control unit 18 in advance, the temperature can be grasped in real time. The temperature control unit 18 is also implemented by the above-described PC or the like. Therefore, in the present specification, the baseline control unit 15 and the temperature control unit 18 may be collectively referred to as a control unit, and the control unit can control the output of the first heater and the output of the second heater.

When the temperature of the cold head 19 in the dilution refrigerator is to be stabilized, the first heater 13 is disposed inside the cold head 19 as shown in FIG. 3. The first heater 13 is connected to the temperature control unit 18. When a target temperature is set in the temperature control unit 18, the temperature control unit 18 controls the output of the first heater 13 based on the temperature of the first thermometer 12. In the case of the ADR, the temperature of the cold head 19 is kept constant by controlling a magnetic field strength applied to a magnetic body based on the temperature of the first thermometer 12. The case of the dilution refrigerator will be described later, and the same method can be applied to the ADR.

As can be seen from Equations (1) and (2), the pulse height value ΔI increases as the temperature of the cold head 19 decreases, and conversely, the pulse height value ΔI decreases as the temperature of the cold head 19 increases. The temperature of the cold head 19 is monitored by the first thermometer 12. The temperature control unit 18 adjusts the output of the first heater 13 so that the temperature of the first thermometer 12 is constant, and keeps the temperature of the cold head 19 constant.

The baseline monitor mechanism 6 monitors the change in the baseline current, which is the current flowing through the TES 1. The baseline current is a current that flows through the TES 1 in a stable and steady manner, and thus the baseline current has statistical fluctuations. Therefore, for example, it is preferable to average about 1000 pieces of sampling data and monitor an averaged value. For example, a current value that is the output of the room temperature amplifier 11 is monitored by an analog-to-digital converter (ADC) with a speed of 1 MS/sec, and a large number of data with a sampling interval of 1 μsec are obtained and averaged. The processing of the sampling data of the baseline monitor mechanism 6 can be implemented by the above-described PC or the like. A detailed functional description of the baseline monitor mechanism 6 will be given at the end of the description of the embodiment.

As described above, when the baseline current fluctuates due to thermal fluctuations from the outside of the TES 1, the pulse height value ΔI fluctuates. Therefore, in order to make the pulse height value ΔI constant, it is necessary to make the baseline current constant. The second heater 14 and the baseline control unit 15 are provided to stabilize the baseline current. The second heater 14 is connected to the baseline control unit 15. When a target baseline current is set on the GUI screen of the baseline control unit 15 for adjusting the baseline current and the output of the second heater, the baseline control unit 15 controls the output of the second heater 14 based on the baseline current input from the baseline monitor mechanism 6.

In FIG. 3, the temperature control unit 18 and the baseline control unit 15 are shown as separate functional blocks, and can be implemented as program processing of the PC that functions as the control unit described above, and the GUI screen described above can be displayed by using the display unit thereof. Further, it is also possible to use both a display unit for displaying the GUI screen and the spectrum display unit 7 for displaying the histogram in common.

As an example shown in FIG. 4, the GUI screen of the baseline control unit 15 for controlling the baseline current and the second heater displays, for example, a baseline current control screen 24 for setting a baseline current setting value, three elements of a PID value of a proportional integral differential controller (PID controller), and the ON of the second heater. The baseline current control screen 24 further displays graphs showing time changes of the obtained baseline current and the output of the second heater.

In order to prevent the control of the first heater 13 and the control of the second heater 14 from interfering with each other, the second heater 14 is disposed at a fairly short distance of about 1 cm from the TES 1 and controls the baseline current with the output sufficiently smaller than the output of the first heater 13. As described above, since the second heater 14 is disposed at a position fairly close to the TES 1, it is preferable to dispose the second heater 14 on the TES chip 17 on which the TES 1 is mounted.

Further, in the radiation analyzer of the present embodiment, it is desirable that the second heater is preferably a non-magnetic body. Accordingly, it is possible to prevent the influence of the magnetic field on the sensitivity of the transition edge sensor. For example, the second heater 14 may use a non-magnetic body such as gold. Further, in the radiation analyzer of the present embodiment, it is desirable that the second heater has a meander structure or a folded wiring structure, which can prevent the influence of the magnetic field on the sensitivity of the transition end sensor.

Furthermore, in the radiation analyzer of the present embodiment, it is desirable that a fluctuation range of the temperature of the cold head is 0.1 mK or less and a fluctuation range of the baseline current is 0.1 µA or less. Accordingly, a fluctuation range of the measured radiation energy can be set to 1 eV or less, which is used as a bin width of the energy spectrum. That is, in the radiation analyzer 100 of the present embodiment, the temperature of the cold head and the baseline current are permanently detected and controlled so that the temperature of the cold head and the baseline current do not deviate from default values, the fluctuation range of the temperature of the cold head is 0.1 mK or less, and the fluctuation range of the baseline current flowing through the TES 1 is 0.1 µA or less. Accordingly, the fluctuation range of the measured radiation energy can be set to 1 eV or less, which is used as the bin width of the energy spectrum, and it is possible to obtain a long-term stable and high energy resolution.

By using a flowchart of FIG. 5, for example, a flow of measurement preparation by the PC or the like that is the control unit will be described. After confirming that the refrigerator is sufficiently cooled, when the temperature control unit 18 of the control unit sets a reference temperature, the output of the first heater 13 is adjusted based on the temperature obtained by the first thermometer 12, and the temperature of the cold head 19 reaches a reference value and then fluctuates around the reference value (S1).

After the fluctuation range of the temperature becomes smaller than 0.1 mK (S2), when the baseline control unit 15 of the control unit sets a reference baseline current, the output of the second heater 14 is adjusted based on the baseline current obtained by the baseline monitor mechanism 6, and the baseline current reaches a reference value and then fluctuates around the reference value (S3). When the fluctuation range of the baseline current becomes smaller than 0.1 µA, the measurement preparation ends and an analysis with a long-term stable and high energy resolution becomes possible.

That is, the control unit controls the output of the first heater to set the fluctuation range of the temperature to 0.1 mK or less, and controls the output of the second heater to set the fluctuation range of the baseline current to 0.1 µA or less. Further, when the control unit controls the first heater of the cold head and the fluctuation range of the temperature becomes 0.1 mK or less, the control unit controls the output of the second heater based on the baseline current to set the fluctuation range of the baseline current to 0.1 µA or less.

According to the radiation analyzer of the first embodiment described above, it is possible to obtain a long-term stable and high energy resolution by a direct method with high data reliability without the need to correct the current flowing through the TES or the pulse height value of the signal pulse of the TES.

Second Embodiment

In the second embodiment, a plurality of TESs are provided in a radiation analyzer and one of the TESs is used as a baseline monitor TES. That is, when it is possible to provide a plurality of TESs in the radiation analyzer 100, at least one baseline monitor TES is provided in addition to the TES 1 that detects radiation. By providing a shield that shields radiation such as X-rays in the baseline monitor TES, it is possible to prevent a change in a baseline current due to the emission of radiation and more accurate control of the baseline current is possible.

That is, the plurality of TESs are disposed on a TES chip of the second embodiment, and at least one TES is a baseline monitor TES that monitors the baseline current, and the baseline monitor TES is connected to a baseline monitor mechanism via a current detection mechanism. Further, the plurality of TESs for detecting radiation other than the baseline monitor TES are connected to a spectrum display unit via respective current detection mechanisms and pulse height analyzers thereof. The spectrum display unit displays a spectrum obtained by adding analysis data of the pulse height analyzers of the plurality of TESs for detecting radiation.

FIG. 6 shows a configuration example of the TES chip of the radiation analyzer according to the second embodiment. As shown in FIG. 6, four TESs 1 for detecting radiation are disposed on a TES chip 30, and a baseline monitor TES 31 and the second heater 14 are disposed to be close to the TESs 1. On a back surface of the TES chip 30 below the TES, a cavity 32 for forming a membrane is disposed as described later.

FIG. 7 is a cross-sectional view showing an AA' cross section of the TES chip 30 in FIG. 6. As shown in the figure, on the TES chip 30, absorbers 21 constituting the plurality of TESs 1 are disposed on the second thermometer 22. In the TES schematic diagram shown in FIG. 2, although the second thermometer 22 is disposed above the absorber 21, the absorber 21 is actually disposed above the second thermometer 22. The cavity 32 for forming the membrane 23 is formed on the back surface of the TES chip 30 below the TES 1. For example, a size of the TES chip is 6×6 mm, the absorber 21 and the second thermometer 22 is 0.4×0.4 mm, and the cavity 32 for forming the membrane 23 is 0.6×0.6 mm.

FIG. 8 is a cross-sectional view corresponding to AA' in FIG. 6 and shows a configuration example in which a collimator is disposed on an upper surface of the TES chip 30 in FIG. 6. A collimator 33 covers the TES chip 30 and is adhered to the TES chip 30. The collimator 33 has four holes 34 in portions corresponding to the four TESs 1 on the TES chip 30. No holes are formed above the baseline monitor TES 31, and the baseline monitor TES 31 includes a shield that is not exposed to radiation.

In the radiation analyzer using the TES chip having the configuration according to the second embodiment, each of the plurality of TESs 1 is connected to the corresponding current detection mechanism 4 and the pulse height analyzer 5, and the output of the plurality of TESs 1 are added and displayed on the spectrum display unit 7. On the other hand, the baseline monitor TES 31 is connected to the baseline monitor mechanism 6 via the corresponding current detection mechanism 4, and the output of the second heater 14 is controlled based on the baseline current of the baseline monitor TES 31.

According to the radiation analyzer of the second embodiment described above, amore long-term stable and high energy resolution can be obtained by a direct method with high data reliability.

Subsequently, functions of the baseline monitor mechanism used in each embodiment will be described. Since the baseline current is a current that flows through the TES in a stable and steady manner, in the baseline monitor mechanism 6, it is necessary to first detect a pulse or the like when X-rays are emitted on the TES 1 and remove the detected pulse or the like. As a method for detecting a pulse or the like, a method for setting a threshold and detecting a signal exceeding the threshold is common, but the method may not be used when the baseline current itself fluctuates. Therefore, by using a first-order differentiation value of the obtained signal, it is possible to detect a pulse or the like that is not related to the current baseline current. This is because the first-order differentiation value is almost 0 in a baseline region. Further, when a pulse or the like is detected by setting a threshold in this way, there is a region where the influence of the pulse remains before and after a detection point. Accordingly, it is necessary to remove signals of an appropriate number of sampling points of about 100 to 1000 before and after that region. Further, as described above, since the baseline current has statistical fluctuations, it is necessary to use a value obtained by averaging data of a plurality of points as the baseline current.

FIG. 9 shows a flowchart showing a function of the baseline monitor mechanism 6, and FIG. 10 shows an example of the baseline current value. In FIG. 10, a horizontal axis represents the sampling point and a vertical axis represents the baseline current value. As described above, in the baseline monitor mechanism 6, for example, it is preferable to average about 1000 pieces of sampling data and monitor an averaged value. Therefore, for example, data of one point is obtained every 1 μsec, and current value sampling data of a total of 1100 points is obtained and stored (S91). After that, when next current value sampling data of one point is obtained (S92), it is determined whether a difference between latest two points exceeds the threshold (S93). The difference processing is an approximation of the first-order differentiation value described above.

When the difference does not exceed the threshold (No), an average value of current values of a total of 1001 points from the 1100th point to the 100th point is set as the baseline current value and sent to the baseline control unit 15 in FIG. 1. The baseline control unit 15 controls the second heater 14 based on the baseline current value (S94).

When the difference value exceeds the threshold (Yes, at a 1137th point in FIG. 10), new current values of 900 points are obtained (S95). The baseline current value during that period does not change as the baseline current value during obtaining of sampling data immediately before exceeding the threshold. When the current values of 900 points are obtained, current values of latest 1001 points are erased (erased from a 1037th point to a 2037th point, S96). After that, it is determined whether the number of current values to be obtained sequentially is 1100 or more (S97). If there are 1100 points (Yes, at a 2102nd point in FIG. 10), the flow returns to S92, S93. In this embodiment, the baseline current value during obtaining of the 2102nd point is 15.014, which is the average value from a 1st point to a 1001st point.

The technical scope of the invention is not limited to the above-described embodiments and various modifications can be added to the above-described embodiments without departing from the spirit of the invention. That is, the configurations of the above-described embodiments are only examples and can be changed as appropriate. Further, the above-described embodiments are described in detail for better understanding of the invention, and are not necessarily limited to the embodiments that include all the configurations described above.

Further, although an example of creating a program for implementing a part or all of the configurations, functions, and control units described above is mainly described, it is needless to say that a part or all of them may be implemented by hardware, for example, by designing an integrated circuit. That is, all or a part of the functions of the control units may be implemented by an integrated circuit such as an application specific integrated circuit (ASIC) or a field programmable gate array (FPGA) instead of the program.

REFERENCE SIGN LIST

1: TES
2: sensor circuit unit
3: bias current source
4: current detection mechanism
5: pulse height analyzer
6: baseline monitor mechanism
7: spectrum display unit
8: shunt resistor
9: input coil
10: SQUID amplifier
11: room temperature amplifier
12: first thermometer
13: first heater
14: second heater
15: baseline control unit
16: superconducting wiring
17, 30: TES chip
18: temperature control unit
19: cold head
20: heat shield
21: absorber
22: second thermometer
23: membrane
24: baseline current control screen
25: refrigerator
31: baseline monitor TES
32: cavity
33: collimator
34: hole
100: radiation analyzer

The invention claimed is:

1. A radiation analyzer comprising:
a transition edge sensor (hereinafter referred to as TES) configured to detect radiation;
a current detection mechanism configured to detect a current flowing through the TES;
a pulse height analyzer configured to measure a pulse height value based on the current detected by the current detection mechanism;

a baseline monitor mechanism configured to detect a baseline current flowing through the TES;

a cold head configured to cool the TES;

a first heater whose output is adjusted to stabilize a temperature of the cold head; and a second heater whose output is adjusted to stabilize the baseline current.

2. The radiation analyzer according to claim 1, further comprising:

a display unit, wherein the display unit is configured to display one or both of (1) an energy spectrum based on the pulse height value, or (2) a graphical user interface (GUI) for adjusting the baseline current and the output of the second heater.

3. The radiation analyzer according to claim 2, wherein the display unit is configured to display a graph of a time change of the obtained baseline current and a graph of a time change of the output of the second heater on the GUI.

4. The radiation analyzer according to claim 1, further comprising:

a TES chip on which the TES and the second heater are disposed close to each other.

5. The radiation analyzer according to claim 4, wherein the TES chip is provided with a plurality of TESs, and at least one of the TESs is a baseline monitor TES configured to monitor the baseline current.

6. The radiation analyzer according to claim 5, wherein the baseline monitor TES is connected to the baseline monitor mechanism via the current detection mechanism.

7. The radiation analyzer according to claim 5, wherein the baseline monitor TES includes a shield configured to shield radiation.

8. The radiation analyzer according to claim 1, wherein the second heater is a non-magnetic body.

9. The radiation analyzer according to claim 1, wherein the second heater has a meander structure or a folded wiring structure.

10. The radiation analyzer according to claim 1, further comprising:

a control unit configured to control the output of the first heater and the output of the second heater.

11. The radiation analyzer according to claim 10, wherein the control unit is configured to control the output of the first heater to set a fluctuation range of a temperature to 0.1 mK or less, and control the output of the second heater to set a fluctuation range of the baseline current to 0.1 µA or less.

12. The radiation analyzer according to claim 11, wherein when the control unit controls the first heater of the cold head and the fluctuation range of the temperature is 0.1 mK or less, the control unit controls the output of the second heater based on the baseline current to set the fluctuation range of the baseline current to 0.1 µA or less.

13. The radiation analyzer according to claim 1, wherein the current detection mechanism includes a superconducting quantum interference device amplifier (hereinafter referred to as a SQUID amplifier) and a room temperature amplifier configured to amplify and shape an electric signal output from the SQUID amplifier.

14. The radiation analyzer according to claim 5, further comprising:

a spectrum display unit configured to display an energy spectrum based on the pulse height value, wherein each of the plurality of TESs other than the baseline monitor TES are connected to the spectrum display unit via the current detection mechanism and the pulse height analyzer.

* * * * *